United States Patent
Kapusta

Patent Number: 6,043,663
Date of Patent: Mar. 28, 2000

[54] COAXIAL CABLE TEST INSTRUMENTS

[76] Inventor: Joseph V. Kapusta, 1039 Old Northfield Rd., Thomaston, Conn. 06787

[21] Appl. No.: 07/915,033

[22] Filed: Jul. 16, 1992

Related U.S. Application Data

[63] Continuation of application No. 06/541,548, Oct. 13, 1983, abandoned.

[51] Int. Cl.[7] .................................................. G01R 27/26
[52] U.S. Cl. ........................................... 324/539; 340/647
[58] Field of Search ..................................... 324/539, 541, 324/542, 540, 555, 556, 66; 340/647

[56] References Cited

U.S. PATENT DOCUMENTS

| | | | |
|---|---|---|---|
| 2,752,590 | 6/1956 | Towle | 324/54 |
| 3,217,244 | 11/1965 | Glover | 324/51 |
| 4,164,701 | 8/1979 | Gulledge et al. | 324/511 |
| 4,553,085 | 11/1985 | Canzano | 324/542 |

FOREIGN PATENT DOCUMENTS

| | | | |
|---|---|---|---|
| 0652506 | 3/1979 | U.S.S.R. | 324/52 |

*Primary Examiner*—Maura Regan
*Attorney, Agent, or Firm*—St. Onge Steward Johnston & Reens LLC

[57] ABSTRACT

There are two coaxial cable test instruments, of which a primary instrument provides a rump circuit having a battery, a first electric signal device and two probes in series-connection with each other, of which the probes are in the form of the central conductor and surrounding shield parts of a typical coaxial cable connector. The other or secondary instrument provides a second electric signal device which is connected with two further probes in the form of the central conductor and surrounding shield parts of another coaxial cable connector. To test a cable component for a short-circuit, the primary instrument is connected with one of the end connectors of the cable. If the first signal device, for instance a light bulb, then lights up on closure of the rump circuit via the short-circuit bridge between the central conductor and surrounding shield of the cable, the lighted bulb will clearly indicate the short circuit in the cable. However, if the rump circuit remains open, the bulb does not light up and thereby indicates that there is no short-circuit. For a conductivity test of the cable component. Both instruments are connected with both end connectors on the cable. If the rump circuit is then closed via the conductor and shield parts of the cable and the second signal device of the secondary instrument, both signal devices will operate and thereby indicate conductivity of the cable. Conversely, if both signal devices fail to operate, this is a clear indication that the cable lacks conductivity.

3 Claims, 3 Drawing Sheets

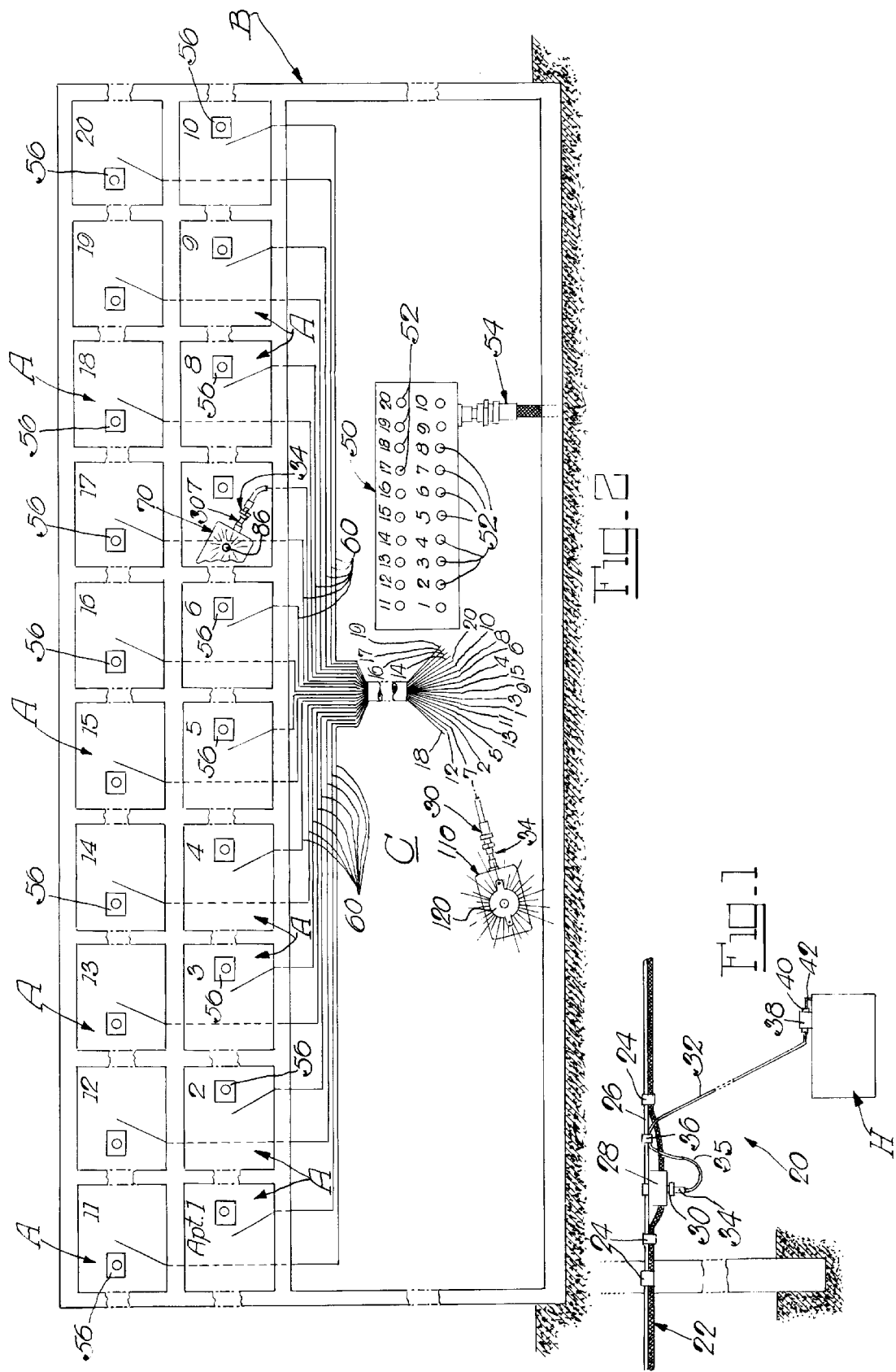

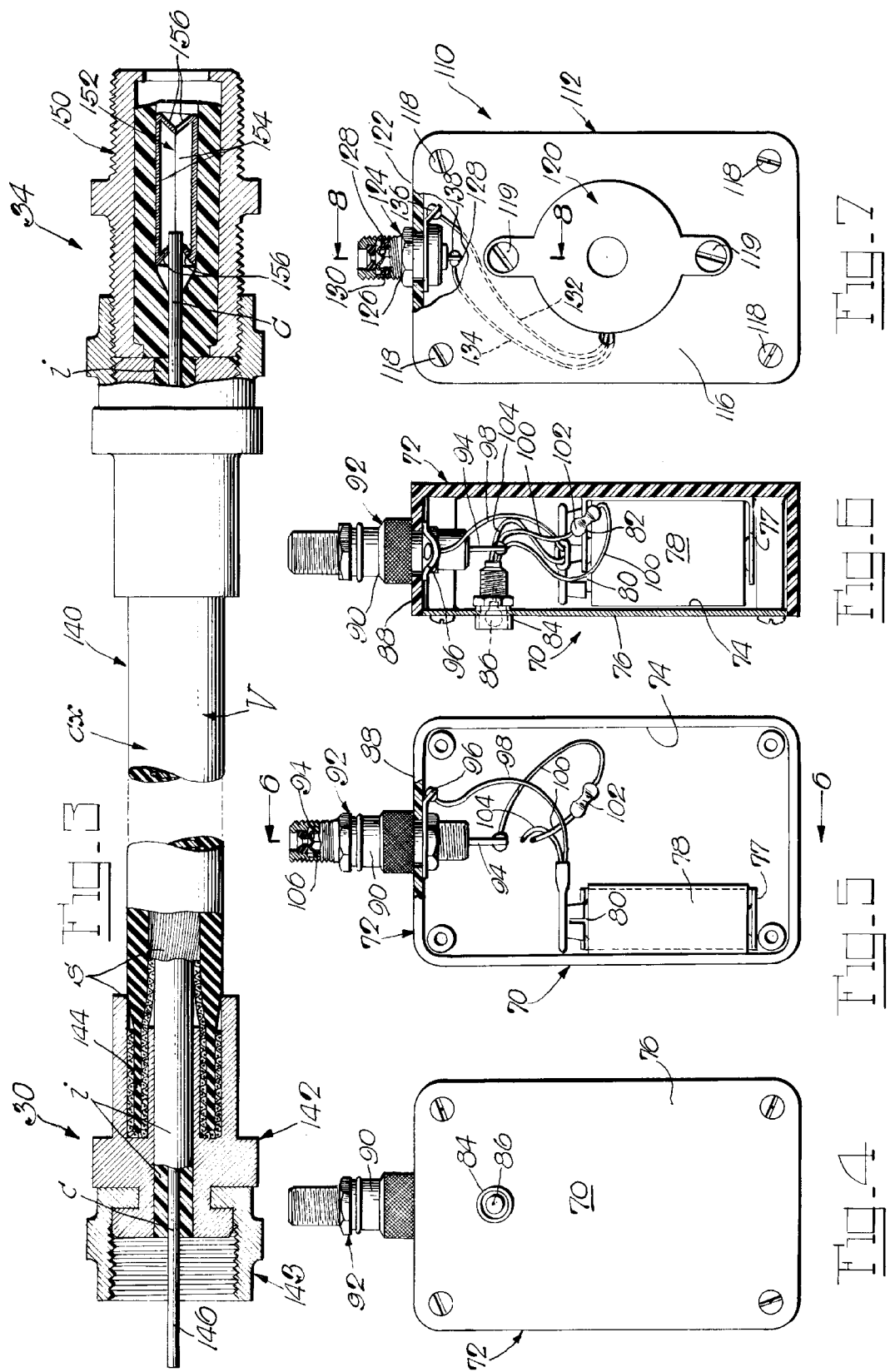

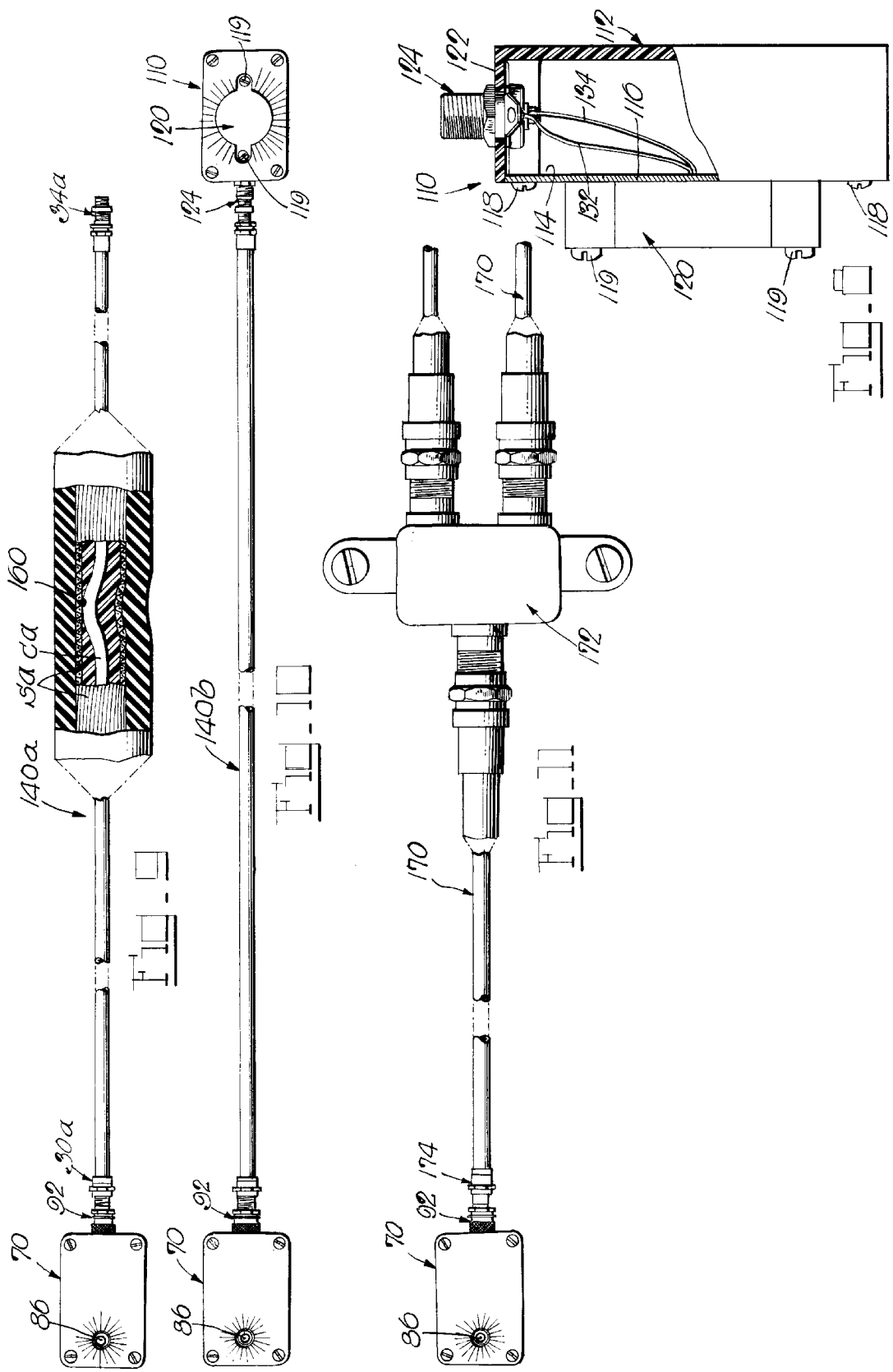

COAXIAL CABLE TEST INSTRUMENTS

This is a continuation of application Ser. No. 06/541,548 filed on Oct. 13, 1983, now abandoned.

This invention relates to test instruments for cable television in general, and to test instruments for the coaxial cable network of cable television in particular.

The major tasks involved in the installation of the coaxial cable network of cable television are the stringing of the feeder cables, and the extension of service drops from the feeder cables to the indoor television apparatus of the customers. The installers engaged in this work, and especially in the oft-repeating extension of service drops from the feeder cables to the customers; television sets, are usually adequately trained for satisfactory performance of their assigned tasks, but they mostly lack adequate knowledge of the intricacies of cable television to recognize and correct the likely causes of malfunctions of service drops as happen in the course of their installation. Thus, malfunctions of service drops, unless due to readily correctible causes such as loose connections in the installation, are caused most frequently by more serious defects in the coaxial cable components of service drops which are usually hidden from view and sometimes difficult to trace. It is for this reason that installers experiencing malfunctions of service drops in the course of their installation are usually instructed not to waste any time on any malfunctions but to call for more experienced technicians and leave it to them to correct the malfunctions. The greater experience of these technicians will, of course, stand them in good stead in normally succeeding to correct these malfunctions with reasonable dispatch, even though the tracing of the causes of some of these malfunctions will at times prove to be a long and sometimes aggravating task even for technicians. Of course, with the labor cost of these experienced technicians being considerably higher than that of less experienced installers, the technicians necessarily add quite considerably to the overall cost of television cable networks, especially since even to this day malfunctions occur on the average in seven percent of all cable network installations. It is thus readily apparent that the cost of correcting malfunctions of cable components in cable television networks, and especially of service drops thereof, comes to an exorbitant share of the total cost of the network installation. The malfunctions with which installers and technicians are mostly confronted in cable television installations are defects in their cable networks, such as short-circuits in coaxial cable components thereof and occasional breaks in their conductors, all of which are mostly hidden from view.

It is a primary object of the present invention to provide apparatus which in case of a malfunction of any installed coaxial cable component of a television network, such as a service drop or even a feeder section, serves in the hands of an operator, such as a technician or even installer, for a quick and reliable check of the malfunctioning cable component for any of the different defects that may account for the malfunction, and for indicating to the operator the nature of any defect found in the checked cable component for quickest possible correction of the malfunction by the operator.

It is another important object of the present invention to arrange the aforementioned apparatus in the form of separate companion instruments, of which a primary instrument serves in the hands of an operator for a quick and reliable check of a malfunctioning coaxial cable component of a television network for a short-circuit defect that would account for the malfunction, and for indicating to the operator the existence of a short-circuit in the checked cable component by a corresponding signal. With a short-circuit in a conducting coaxial cable occurring at the moment of unauthorized or accidental contact between portions of the cable's central conductor and surrounding metal shield including its end connectors, the primary instrument may be of exceedingly simple construction in order to demonstrate all the more tellingly the existence of a short-circuit, with the instrument having to this end as its operating components merely a battery, an electric signal device, and a coaxial cable connector with its customary central conductor and surrounding tubular shield, of which the battery and signal device are in series-connection with each other and with the conductor and shield, respectively, of the connector. Thus, an operator may check a malfunctioning cable component of a network for a short-circuit that may account for the malfunction, by disconnecting either end of the cable component with its connector thereat from the cable network and connecting it with the connector of the primary instrument. If the signal device then fails to operate, there is no short-circuit, but there is a short-circuit if the signal device then operates. Thus, on connecting the connector of the primary instrument with the end connector of the cable component, the series-connected battery, signal device and connectors form a rump circuit which is open across the gap between the central conductor and surrounding shield of the cable component, meaning that there is no short-circuit in the cable component. However, if on so connecting the primary instrument with the cable component the aforementioned rump circuit is closed via the short-circuit bridge connection between the central conductor and surrounding shield of the cable component, the signal device in this closed circuit will be operated to indicate a short-circuit in the cable component, as will be readily understood.

It is a further important object of the present invention to adapt both of the aforementioned primary and secondary instruments for use in the hands of an operator or operators for a quick and reliable check of a malfunctioning cable component of a cable network for conductivity, and for indicating the results of the check by a second signal device which is the main operating component of the secondary instrument that has for its sole remaining operating component a coaxial cable connector of which the central conductor and surrounding shield parts are connected with the second signal device. For checking an installed cable component for conductivity, the same will have to be disconnected from its network at both ends so as to have both of its end connectors available for connection with the connectors of the primary and secondary instruments, respectively. In thus connecting the primary and secondary instruments with the opposite ends of the cable component for a check of the latter for conductivity, the primary instrument will establish in the cable component the aforementioned rump circuit, which in the absence of a short-circuit in the cable component is open across the central conductor and surrounding shield of the latter, and the secondary instrument will augment and close this rump circuit via the connected connector and signal device of this secondary instrument, thereby operating this second signal device to indicate conductivity of the cable component to the operator. Of course, a break in the central conductor or surrounding shield of the cable component would fail to close the rump circuit via the secondary instrument and indicate to the operator non-conductivity of the cable component by lack of a signal from the second signal device, as will be readily understood.

It follows from the preceding that the primary and secondary instruments, which constitute the entire apparatus for quickly and reliably checking cable components for short-circuits and conductivity, are of outstanding simplicity and low cost, and this is due to the highly unique involvement in the operating circuitry of these instruments of the central conductor and surrounding electric shield of the very cable components which are being checked and which also permit checking of cable components regardless of their lengths.

The task of connecting with a cable networktelevision apparatus of prospective customers in multi-unit living quarters, such as apartments in an apartment building, for example, will also bring service drops into the building. These service drops are laid by installers from the basement, for example, of the building through a conduit or other suitable passage or passages to the various apartments at a higher level or levels, whereupon they are connected with the cable network and with wall plates, for example, in selected places in the various apartments. For connection of these service drops with the cable network, there is provided, in this instance in the basement of the building, a lock box with a multiplicity of taps which are connected with a feeder cable. Adapted to be connected with these taps and wall plates in progressive preassigned association with each other are the opposite ends of the service drops. To finish the orderly connections of the service drops with the taps and wall plates, the opposite ends of the service drops at the different levels of the basement and apartments will have to be matched so that the opposite ends of each service drop may be connected with a preferably designated tap and with its associated wall plate, respectively. The featured primary and secondary instruments are ideally suited in the hands of two separate operators to match the ends of the service drops. Thus, one operator, for example the one at an apartment level, may mark the nearby ends of the service drops with successive numerals "1", "2", "3", etc, for example, while the other operator is stationed at the basement. The one operator may then connects his primary instrument with the end of service drop "1", for example, and through a walkie-talkie tells the other operator to connect his secondary instrument with the ends of the nearby service drops until the second signal device on his instrument is operated to indicate that this second instrument is connected with the matching end of the same service drop, whereupon he may mark this end with the corresponding numeral "1". The two operators repeat this procedure until all matching ends of the service drops are marked, whereupon the operators may connect the marked ends of the service drops with their designated taps in the lock box and with the associated wall plates in the apartments.

The primary instrument is further useful in indicating the interposition of a splitter in a cable component of a cable network for connecting two or more television apparatus with the same cable component. Thus, by disconnecting the cable component from the cable network and connecting it with the primary instrument, operation of the signal device of this primary instrument will, in the absence of a short-circuit in the cable component, indicate the interposition of a splitter in the cable component. Of course, while the use of the primary instrument for indicating an interposed splitter in a cable component is of general interest, it assumes particular interest in spotting unlawful splitters in cable components with free use of cable television by one or more parties.

Further objects and advantages will appear to those skilled in the art from the following, considered in conjunction with the accompanying drawings.

In the accompanying drawings, in which certain modes of carrying out the present invention are shown for illustrative purposes:

FIG. 1 is a diagrammatic view of a cable network for a television installation in a private home:

FIG. 2 is a diagrammatic view of part of a cable network for a multi-dwelling television installation:

FIG. 3 is an enlarged side elevation, partly in section, of a cable component of a television cable network:

FIG. 4 is a front view of a test instrument embodying the present invention:

FIG. 5 is a front view of the test instrument of FIG. 4 with its cover removed:

FIG. 6 is a section through the same instrument as taken on the line 6—6 of FIG. 5:

FIG. 7 is a front view of another test instrument which is a companion to the test instrument of FIG. 4:

FIG. 8 is a side view, partly in section, of the same test instrument, with the section being taken on the line 8—8 of FIG. 7;

FIG. 9 is a reduced view of a cable component connected with the instrument of FIG. 4 for a test procedure, with part of the cable component being shown in enlarged section:

FIG. 10 is a reduced view of a cable component, with the instruments of FIGS. 4 and 7 connected at opposite ends for a test procedure: and FIG. 11 is a reduced view of a cable component with an interposed splitter, and one of the test instruments being shown connected with one end of the cable component for a test procedure.

Referring to the drawings, and more particularly to FIG. 1 thereof, the reference numeral 20 designates a typical cable network installation for television apparatus in a private home H, for example. The installation includes a feeder cable 22 that is suspended from spaced holders 24 on a cable support wire 26 which in this instance is strung from pole to pole. Interposed in the feeder cable 22 is a customary tap plate 28 with a male connector 30 which connects the feeder cable with a service drop 32 through intermediation of a disconnectible connector 34, with the connectors 30 and 34 being conventional coaxial cable connectors as shown in greater detail in FIG. 3, for example. A loose top loop 35 of the service drop 32 is as usual held to a strap 36 on the cable support wire from where it is extended to the nearby home H and into a ground block 38 wherein it is releasably connected at 40 with a coaxial cable lead-in 42 that is extended usually through the basement of the home into the room in which the television apparatus is located, and is there connected with the television apparatus.

In finishing this installation, and then turning on the connected television apparatus to test the installation, immediate playing response of the television will, of course, indicate proper functioning of the installation throughout as will be described in greater detail hereinafter.

FIG. 2 shows another typical cable network installation for television apparatus in multi-unit living quarters in a larger building complex, such as apartments A in an apartment building B, for example. The building B has a basement C over which the apartments are arranged, in this instance on two floors. Provided in the basement C is a lock box 50 with a multitude of taps 52 which are connected with an extension 54 of a nearby feeder cable. Each apartment is provided in a selected television room thereof with an exemplary wall plate 56 with which the associated television set is adapted to be connected for performance. The various service drops 60 are led from the basement C through conduits or other suitable passages in the building B to the television rooms in the various apartments A, for the purpose of being connected with their opposite ends to the wall plates 56 in the apartments and to their associated taps 52 in the lock box 50 in the basement C in a manner explained hereinafter, to thereby finish the installation.

Reference is next had to FIGS. 4, 5 and 6 which show one of the featured companion test instruments, in this case the primary instrument 70. The instrument 70 provides a case 72 of preferred hand-grip size, with this case having an open front 74 which is normally closed by a screwed-on cover 76. Releasably secured to a bracket 77 in the case 72 is a battery 78 having negative and positive terminals 80 and 82. Suitably secured in the cover 76 is a socket 84 for an signal device, such as a light bulb 86. Further secured to the top wall 88 of the case 72 is the outer or sleeve part 90 of a female connector 92 for typical coaxial cable use, which has also a central conductor part 94 (FIG. 5) The outer connector part 90 is by a conductive strap 96 and a lead 98 connected with one of the battery terminals 80 and 82, while the central conductor part 94 of the connector 92 is connected with one side of the light bulb 86 by a lead 100 with an exemplary interposed resistor 102, and the other side of the light bulb 86 is through a lead 104 connected with the other terminal of the battery 78. The sleeve part 90 of the connector 92, strap 96, lead 98, the battery terminals 80 and 82, lead 104, light bulb 86, lead 100 and the central conductor part 94 of the connector 92, form a rump circuit which is open across the insulated gap 106 between the outer sleeve and inner conductor parts 90 and 94.

FIGS. 7 and 8 show the secondary instrument 110 which also provides a case 112 with an open front 114 which is normally closed by a cover plate 116 by means of screws 118. Suitably secured to the outside of the cover plate 116, as by screws 119 is another electric signal device in the exemplary form of a buzzer 120. Further secured to the top wall 122 of the case 112 is a connector 124 which may be identical with the connector 92 on the primary test instrument 70. The connector 124 thus has an outer sleeve part 126 which is screwed to the top wall 122 of the case 112, and further has a central conductor part 128 which is spaced from the outer connector part 126 by an insulation-filled gap 130. The electric buzzer 120 is by leads 132 and 134 connected with the outer and inner parts 126 and 128 of the connector 124 as at 136 and 138, respectively.

Reference is now had to FIG. 3 which shows a typical cable component 140 that may have been temporarily disconnected from either of the cable networks of FIGS. 1 and 2 for the purpose of undergoing a certain test or tests with the described instruments 70 and 110 of FIGS. 4 and 7. The cable component 140 is composed of a length of typical coaxial cable cx, having the usual conductor c with the surrounding insulation coating i and customary braided metal shield s with the final outer insulation cover V. The connectors 30 and 34 are applied to the cable component just prior to its installation in a cable network as a service drop or otherwise, with the connectors being so applied to the cable component customarily by installers in a generally followed fashion somewhat as follows. Thus, attached to the left end of the cable component 140, for example, is a typical male connector 30 that may be used for coaxial cable, with this exemplary connector 30 having as its components a body 142 and a captive nut 143. In attaching the connector to the cable by an installer, he usually cuts off an end piece of the outer cable coat V to expose a length of the shield s over the insulation coating i, whereupon he strips the exposed shield length back over the outside of the outer cable coat V as at 144, and then forces the several parts of the cable endwise into firm reception in the connector body 142, as shown, whereby the connector is securely clamped to the coaxial cable. A front piece 146 of the central conductor c has also been bared and forms the central conductor of the connector 30. The female connector 34 at the opposite end of the cable component 140 may be similar to the connector 30, except that an adapter 150 has been added. The adapter 150 has a female conductor 152 of companion parts 154 with conical ends 156 that yield open on entry of conductors, such as the central conductor c of the cable component 140 and the conductor of a male connector that may be applied to the "female" connector 34.

Assuming now that an installer is confronted with a malfunction of a television set which he just connected with a cable network as in FIG. 1 or FIG. 2, he may check any one or more of the cable components that are involved in the likely cause of the malfunction until he finds the component with the defect which accounts for the malfunction. To this end, the installer, or a technician, may disconnect from the cable network any one cable component which he selects, such as the cable component 140a with its mounted end connectors 30a and 34a (FIG. 9). The operator, say an installer, may then check the cable component for a short-circuit which, if found, may well account for the malfunction. To this end, the operator will grasp the primary instrument 70 and momentarily connect its connector 92 with either end connector, in this case connector 30a, of the cable component. The moment the connectors 92 and 30a are connected, the aforementioned rump circuit of the primary instrument is applied to the cable component, with the result that this rump circuit remains open if there is no short-circuit, but in case of a short-circuit will be closed and thereby energize and light the exemplar signal bulb 86 which is part of the circuit and, when lighted, unmistakably indicates to the operator a short-circuit in the cable component. The short-circuit occurred in this instance at the contact 160 between the central conductor ca and surrounding shield sa as a result of local displacement of the conductor by a heavily applied staple over the cable component, for example, in the course of its attachment to some suitable support. This is just one example of a short-circuit that may occur in a cable component in the course of its installation, and it is obvious that short-circuits may occur at many other places in a coaxial cable component. Thus, short-circuits are caused quite often by the shields of a cable. To check a cable component for a short-circuit, the primary instrument 70 need be connected with only one end, which may be either end, of the cable component, so that for a short-circuit check of a cable component the same need be disconnected from its network with one end only. With the operator having immediate and positive indication of the existence of a short-circuit from the light bulb 86 of his instrument 70, he or a more experienced technician may be called upon to repair the short-circuit if this can be done expeditiously, as otherwise it may be a accomplished in shorter time and at lower cost by simply replacing the short-circuited cable component with a new one.

Malfunction of a cable network may also occur due to a break of the conductor in a cable component and thus compel an operator to check an involved cable component or components for conductivity. To this end, the operator may disconnect a single cable component 140b from its network (FIG. 10) and subject it to a conductivity test. To this end, the operator uses his primary and secondary instruments 70 and 110. He may first connect the primary instrument 70 with the mounted connector at either end of the cable component 140b, and if the light bulb 86 then fails to light up, the operator has also assurance that there is no short-circuit in the cable component. Next, and while holding the primary instrument 70 connected with one end of the cable component 140*b*, the operator will also connect his secondary instrument with the opposite end of the same cable component. If both signal devices of the instruments, i.e., the light bulb 86 and the buzzer 126, then operate, the aforementioned rump circuit in the primary instrument 70 is closed via the central conductor and surrounding shield of the cable component and the therewith connected buzzer 120 of the secondary instrument 110 at the opposite end of the cable component, whereby the lighted bulb 86 and the sounding buzzer 120 indicate to the operator that the cable component has conductivity throughout. Conversely, if both signal devices 86 and 120 are not operated, this will indicate to the operator non-conductivity of the cable component and thus call either for repair of the latter if feasible, or for replacement of the same if more economical.

The primary and secondary instruments 70 and 110 are also highly useful in installing a cable network in the apartment building B, for example, for connection of the television apparatus (FIG. 2). The installation of this cable network has already been described previously to some extent and, hence, need not be repeated here. However, this installation requires matching of the opposite ends of the multitude of service drops 60 at the different basement and apartment levels in the building for correct connection of these ends of the service drops with the wall plates 56 in the various apartments A and with the taps 52 in the lock box 50, and this is accomplished advantageously by two installers with the help of the featured primary and secondary instruments 70 and 110. Thus, with the service drops 60 bunched and their upper ends extended into the various apartments which are preferably marked with exemplar consecutive numerals from "1" to "20" as shown in FIG. 2, the operator at the apartment level may connect his instrument, for example the primary instrument 70, with the end of the service drop in apartment "7", for instance, and through a walkie-talkie request the operator in the basement C to connect his instrument, in this case the secondary instrument 110 with successive ends of the nearby service drops until the buzzer 120 on his instrument sounds. Sounding of the buzzer in this fashion indicates to the operator in the basement that his instrument 110 is now connected with the correct end of the service drop from apartment "7", and he may then mark this end of the drop with the numeral "7" for subsequent connection with the tap "7" in the lock box 50. The operator in apartment "7" will also be notified by light-up of the bulb 86 in his instrument 70 of the finding of the matching end of the service drop by the other operator's instrument 110, and he may then connect the end of the service drop in apartment "7" with the wall plate 56 therein. The operator in the basement may also connect the matching end of the service drop with the tap "7" in the lock box 50, thereby concluding the installation in the cable network of the service drop from apartment "7". The ends of the other service drops 60 may be matched in the same fashion by the operators with their instruments 70 and 110 and then connected with the wall plates 56 in the remaining apartments and their associated taps 52 in the lock box 50.

While it is entirely in order for cable television companies to interpose splitters in their own networks for connecting more than one television apparatus with a common service drop, for example, the interposition of such a splitter in an installed service drop by an unauthorized party for connecting an additional television set therewith and using it free of charge is illegal, and it is in the interest of cable television companies to stop the use of such illegal splitters. The featured primary instrument 70 is ideally suited to spot an interposed splitter in a service drop even when the splitter is well hidden from view. Thus, and with reference to FIG. 11, there is shown a service drop 170 that leads to a television set of a paying customer, and someone known or unknown to the customer interposed a splitter 172 in the service drop 170 to operate his or her television set without paying for it. In that case, an operator from the cable television company may check the service drop 170 for an illegally interposed splitter by disconnecting the service drop at its en connector 174 and connecting the primary instrument 70 therewith. With the splitter 172 having been interposed in the service drop 170 in this instance, its presence is indicated by light-up of the light bulb 86.

What I claimed is:

1. A portable test instrument for coaxial cable which comprises:
   a test circuit comprising, in series, a battery, a device capable of generating a signal in response to completion of said circuit, a first probe and a second probe, wherein said first probe and said second probe comprise a central conductor and surrounding sheild, respectively, of a test circuit connector which is releasably connectable to a coaxial cable connector mounted on a first end of the coaxial cable to be tested, such that a short circuit in the coaxial cable to be tested will complete said test circuit and cause said signal device to generate a signal; and
   a hand-grip size case in which said test circuit is mounted, wherein said test circuit connector is mounted on the outside of said case.

2. A portable test instrument according to claim 1, in which said battery is mounted in said case.

3. A portable test instrument for coaxial cable:
   a) comprising a first test circuit which comprises, in series,
      i) a battery,
      ii) a first probe, and
      iii) a second probe,
   wherein said first probe and said second probe comprise a central conductor and surrounding sheild, respectively, of a test circuit connector releasably connectable to a coaxial cable connector mounted on a first end of the coaxial cable to be tested;
   b) a second test circuit which comprises, in series,
      i) a device capable of generating a signal in response to a completion of a circuit involving said first test circuit, said second test circuit and the coaxial cable to be tested,
      ii) a third probe, and
      iii) a fourth probe,
   wherein said third probe and said fourth probe comprise a central conductor and surrounding sheild, respectively, of a second test circuit connector releasably connectable to a coaxial cable connector mounted on a second end of the coaxial cable to be tested, such that connection of said first test circuit connector to the coaxial cable connector mounted on the first end of the coaxial cable to be tested and connection of said second test circuit connector to the connector mounted on the second end of the coaxial cable to be tested will complete a circuit involving said first test circuit, said second test circuit, and said coaxial cable when there is no short circuit in said coaxial cable, and thereby cause said signal device to generate a signal; and
   c) a hand-grip size case in which said test circuits are mounted, wherein said test circuit connectors are mounted on the outside of said case.

\* \* \* \* \*